(12) United States Patent
Arsenault

(10) Patent No.: US 8,736,952 B2
(45) Date of Patent: May 27, 2014

(54) PHOTONIC CRYSTAL DEVICE

(75) Inventor: Andre Arsenault, Toronto (CA)

(73) Assignee: Opalux Incorporated, Toronto (CA)

( * ) Notice: Subject to any disclaimer, the term of this patent is extended or adjusted under 35 U.S.C. 154(b) by 339 days.

(21) Appl. No.: 13/060,251

(22) PCT Filed: Aug. 20, 2009

(86) PCT No.: PCT/CA2009/001170
§ 371 (c)(1),
(2), (4) Date: May 18, 2011

(87) PCT Pub. No.: WO2010/020054
PCT Pub. Date: Feb. 25, 2010

(65) Prior Publication Data
US 2011/0222142 A1    Sep. 15, 2011

Related U.S. Application Data

(60) Provisional application No. 61/090,258, filed on Aug. 20, 2008, provisional application No. 61/097,335, filed on Sep. 16, 2008.

(51) Int. Cl.
*G02B 26/00* (2006.01)
*H01S 3/00* (2006.01)
*H01L 29/04* (2006.01)
*H01L 29/10* (2006.01)
*H01L 31/036* (2006.01)
*H01L 29/00* (2006.01)

(52) U.S. Cl.
USPC ............... 359/297; 359/342; 257/64; 257/65

(58) Field of Classification Search
USPC ............ 359/831–833, 290–298, 7, 322–324, 359/342; 257/49–50, 64–69
See application file for complete search history.

(56) References Cited

U.S. PATENT DOCUMENTS

| 6,261,469 B1 | 7/2001 | Zakhidov et al. ............... 216/56 |
| 2004/0131799 A1 | 7/2004 | Arsenault et al. |

(Continued)

FOREIGN PATENT DOCUMENTS

| CA | 2653689 A1 | 12/2007 |
| CN | 1466700 | 1/2004 |

(Continued)

OTHER PUBLICATIONS

International Search Report and Written Opinion for PCT/CA2009/001170 dated Dec. 2, 2009.

(Continued)

*Primary Examiner* — Joseph P Martinez
*Assistant Examiner* — Brandi Thomas
(74) *Attorney, Agent, or Firm* — Fulbright & Jaworski LLP

(57) ABSTRACT

A photonic crystal device comprising: a photonic crystal material having an initial ordered structure and a viewing surface, the initial ordered structure giving rise to a first optical effect detectable from the viewing surface; and a removal layer removably attached with the viewing surface or an opposing surface of the photonic crystal material opposite to the viewing surface; wherein mechanical removal of at least a portion of the removal layer results in a structural change in at least a portion of the initial ordered structure of at least a portion of the photonic crystal material respective to the portion of the removed removal layer, thereby resulting in a changed portion different from the initial ordered structure, the changed portion giving rise to a second optical effect detectable from the viewing surface and detectably different from the first optical effect.

29 Claims, 13 Drawing Sheets

(56) References Cited

U.S. PATENT DOCUMENTS

| | | |
|---|---|---|
| 2004/0224154 A1 | 11/2004 | Toda et al. |
| 2005/0228072 A1 | 10/2005 | Winkler et al. |
| 2008/0037131 A1 | 2/2008 | Steenblik et al. ............. 359/619 |
| 2010/0150511 A1* | 6/2010 | Arsenault et al. ............. 385/130 |

FOREIGN PATENT DOCUMENTS

| | | |
|---|---|---|
| JP | 2003-043273 | 2/2003 |
| WO | WO 2008/017869 A1 | 2/2008 |
| WO | WO 2008/098339 A1 | 8/2008 |
| WO | WO 2010/020054 | 2/2010 |

OTHER PUBLICATIONS

European Patent Office, Examination Report in European Patent Application No. 09807797.7 (Aug. 1, 2012).
Park et al., "Mechanically Tunable Photonic Crystal Structure," Applied Physics Letters, vol. 85, No. 21 (Nov. 22, 2004) pp. 4845-4847, XP012063477.
Extended European Search Report for 09807797.7 dated Oct. 13, 2011.
Office Communication and Search Report issued in Chinese Patent Application No. 200980141489.1, mailed Mar. 13, 2013.

* cited by examiner ical fields is described in U.S. Patent Application Publication
PHOTONIC CRYSTAL DEVICE

TECHNICAL FIELD

The present disclosure is related to the field of photonic crystals. In particular, the present disclosure describes a photonic crystal device having a removal layer.

BACKGROUND

From the first inclusion of color into banknotes to the printing of modern color-shifting inks, the use of color has long been an effective tool in the fight against counterfeiting. Photonic crystals, similar to precious opal gemstones, display bright reflections of color due to a three-dimensional ordered internal structure.

Photonic crystals are materials having a periodic modulation in their refractive index (Yablonovitch, Phys. Rev. Lett., 58:2059, 1987), giving rise to a photonic band gap or stop gap, in which the propagation of electromagnetic waves within certain ranges of wavelengths is inhibited or restricted. The positions of these bands are dependent on the distance between the periodic modulations in the crystal. The reflected stop band wavelengths can appear in the reflectance spectrum as a distinct reflectance peak known as a Bragg peak. The crystal may have a one-, two-, or three-dimensional (3-D) periodic structure.

A three-dimensional photonic crystal has an ordered periodicity in all three dimensions. Such a structure has stop bands for incident light in all directions. Methods for manufacturing these three-dimensional photonic crystals include holographic writing/curing followed by etching and self-assembly of spherical microparticles. Such photonic crystals may also be inverse crystals, in which the periodic structure of the crystal comprises a periodic array of spherical voids.

An inverse photonic crystal can be manufactured using a colloidal photonic crystal template. The three-dimensional photonic crystals formed by spherical microparticles are used as a template for infiltration. When the particulate template is removed, the result is an inverse photonic crystal having a three-dimensional ordered array of voids. Such a templating strategy is disclosed in U.S. Pat. No. 6,261,469. The photonic crystal disclosed in this reference is in block form, which may not be suitable in many applications.

When the dimensions of the distances between the three-dimensional periodic modulations of particles or voids are commensurate with the wavelength of visible light, the reflected stop band of the photonic crystals lies within the energy range of visible light. By using particles or void diameters ranging from 150 nm to 1000 nm, colors encompassing the ultraviolet, visible, and infrared range of the electromagnetic spectrum can be generated.

Potential applications of three-dimensional photonic crystal films include separation media, elements of optical computers, data storage media, optical filters, and security features.

Due to the sensitivity of a photonic crystal, slight changes in the refractive index or lattice spacing result in detectable shifts of the reflected stop band. This can be employed where the refractive index or the periodic spacing of the photonic crystal is modulated in response to external stimuli or can be controlled by formulating the photonic crystal material composition or by choosing a specific constituting particle diameter for the photonic crystal or the template structure. Examples of such applications are given in U.S. Patent Application Publication No. 2004/0131799, PCT Application No. PCT/CA2007/000236, and U.S. patent application Ser. No. 11/831,679. Deformable photonic crystal are also known, comprising non-close-packed spheres embedded in an hydrogel or elastomer matrix, for example as discussed in U.S. Pat. No. 6,544,800 to Asher, U.S. Pat. Nos. 5,266,238 and 5,368,781 to Haacke et al., by Holtz et al. in Nature 389:829-832, by Foulger et al. in Advanced Materials 13:1898-1901, by Asher et al. in Journal of the Material Chemical Society 116:4997-4998, and by Jethmalani et al. in Chemical Materials 8:2138-2146.

Examples of photonic crystal structures that can respond to external stimuli include colloidal photonic crystals in the form of optical films (Busch et al., Phys. Rev. E, 58:3896, 1998; Xia et al., Adv. Mater., 12:693, 2000). The stop band wavelength ranges of these materials are highly sensitive to changes in the external environment, optical characteristics, or the structure of the photonic crystal.

An example for a photonic crystal device tuned by electrical fields is described in U.S. Patent Application Publication Nos. 2009/0034051 and 2008/0224103 by Arsenault et al., where the device displays a variable structural color throughout the entire visible spectrum by electrically stimulating the contraction and expansion of the lattice structure.

An example for a photonic crystal device tuned by mechanical compression is discussed in PCT Patent Application Publication No. 2008/098339 by Arsenault et. al., where a photonic crystal device is compressed by mechanical force. The resulting structural change, the compression of the lattice parameter, causes a dynamic blue-shift of the stop band. Using an elastic photonic crystal device material formulation, The three-dimensional structure may then revert to its original state and dimensions upon removing the compression force. Such devices are suitable as overt security features, where user interaction can produce an obvious and visible effect indicating the security and safety of the article. Mechanical, thermal, chemical, electrical, magnetic, electromagnetic, or ultrasonic stimuli are suitable to invoke an observable response or photonic band gap shift of the photonic crystal device. An example of a peelable security device is the Wallet-Seal developed and manufactured by Schreiner MediPharm and Schreiner ProSecure and currently used at Bayer Healthcare as security seal for Levitra packaging (Product & Image Security Newsletter, No. 69, June 2009).

SUMMARY

The present disclosure provides a photonic crystal device comprising: a photonic crystal material having an initial ordered structure and a viewing surface, the initial ordered structure giving rise to a first optical effect detectable from the viewing surface; and a removal layer removably attached with the viewing surface or an opposing surface of the photonic crystal material opposite to the viewing surface; wherein mechanical removal of at least a portion of the removal layer results in a structural change in at least a portion of the initial ordered structure of at least a portion of the photonic crystal material respective to the portion of the removed removal layer, thereby resulting in a changed portion different from the initial ordered structure, the changed portion giving rise to a second optical effect detectable from the viewing surface and detectably different from the first optical effect.

In some examples, the device may comprise a support layer attached to the photonic crystal material for supporting the photonic crystal material, the support layer being provided on a surface of the photonic crystal material opposite to the removal layer.

In some examples, the structural change may result from mechanical strain of at least the portion of the photonic crystal material caused by removal of at least the portion of the removal layer.

In some examples, the ordered structure may comprise an ordered lattice of voids.

In some examples, the first optical effect may be a first reflectance in a first wavelength range for light incident to the viewing surface; and the changed portion may include a deformation in the ordered structure respective to the changed portion, the deformation resulting in the second optical effect being a second reflectance in a second wavelength range for light incident to the viewing surface.

In some examples, the changed portion may return to the initial ordered structure at a reversal rate, resulting in a return from the second optical effect to the first optical effect.

In some examples, the photonic crystal material may be susceptible to an external stimulus, the external stimulus preventing the changed portion from returning to the initial ordered structure. In some examples, the reversal rate may be dependent on an external stimulus. For example, the external stimulus may be one of: temperature, water vapor, mechanical deformation, mechanical strain, mechanical stress, and air pressure.

In some examples, the removal layer and/or the support layer may be transparent or translucent.

In some examples, at least a portion of the photonic crystal material may be removed together with at least the portion of the removal layer when at least the portion of the removal layer is removed.

In some examples, at least one of the first optical effect and the second optical effect may include encoded information.

In some examples, the device may comprise a non-adhesive layer between a first portion of the removal layer and a first portion of the photonic crystal material respective to the first portion of the removal layer, wherein at least a second portion of the removal layer and at least a second portion of the photonic crystal material respective to the second portion of the removal layer may be free of the non-adhesive layer; wherein the non-adhesive layer may prevent structural change in the ordered structure of the first portion of the photonic crystal material when the first portion of the removal layer is removed; and wherein the non-adhesive layer may facilitate the encoded information.

In some examples, the encoded information may be effected by an encoding component incorporated into the photonic crystal material.

In some examples, the encoded information may include at least one of: an alphanumeric character, a pattern, an image, and encoded data.

In some examples, the device may further comprise an adhesive layer removably adhering at least a portion of the removal layer to the photonic crystal material.

In some examples, the removal layer may contribute to at least one of the first optical effect and the second optical effect.

In some examples, the support layer may contribute to at least one of the first optical effect and the second optical effect.

In some examples, at least one of the first optical effect and the second optical effect may occur within the visible spectrum, the infrared spectrum, and/or the ultraviolet spectrum.

In some examples, the photonic crystal material may be a thin film material. For example, the photonic crystal film may have a thickness of less than or equal to about 100 micrometers.

In some examples, the removal layer may be a flexible material.

In some examples, the removal layer may be made of a material selected from the group consisting of: papers, glass, plastics, metals, ceramics, and combinations thereof.

In some examples, the photonic crystal material may be a 3-dimensional photonic crystal material, such as a 3-dimensional photonic crystal including an ordered array of voids in a matrix material.

In some examples, the matrix material may be a polymer.

In some examples, the polymer may be selected from the group consisting of: polystyrenes, polymethacrylates, polyacrylates, polyurethanes, polyesters, polyethylenes, polypropylenes, polyvinylchlorides, polyisoprene, polybutadiene, polydienes, waxes, and copolymers or combinations thereof.

In some examples, the polymer may be formed from the polymerization of a precursor mixture.

In some examples, the precursor mixture may contain at least one component selected from the group consisting of: monomers, crosslinkers, initiators, solvents, plasticizers, surfactants, and additives.

In some examples, the monomers may be selected from the group consisting of: acrylates, methacrylate, olefins, ethers, alcohols, polyols, olefins, amino acids, fluoromonomers, biomonomers, cyclic monomers, methacrylic acid esters, acrylic acid esters, isoprene, butadiene, polyurethane precursors, crosslinkable polyethers, polymerizable oligomers, and mixtures thereof.

In some examples, the methacrylic acid ester may be selected from the group consisting of: ethylhexyl methacrylate, lauryl methacrylate, butyl methacrylate, methyl methacrylate, stearyl methacrylate, butoxyethyl methacrylate, and mixtures thereof.

In some examples, the acrylic acid ester may be selected from the group consisting of: butoxyethyl acrylate, hydroxyethyl acrylate, 2-carboxyethyl acrylate, stearyl acrylate, lauryl acrylate, butyl acrylate, hexyl acrylate, and mixtures thereof.

In some examples, the crosslinkable polyether may be selected from the group consisting of polyether diacrylates, polyether acrylates, polyether dimethacrylates, polypropylene glycol diacrylates, polypropylene glycol dimethacrylates, polypropylene glycol acrylates, polypropylene glycol methacrylates, polyethylene glycol diacrylates, polyethylene glycol dimethacrylates, polyethylene glycol acrylates, polyethylene glycol methacrylates, oligoethylene glycol diacrylates, oligoethylene glycol dimethacrylates, oligoethylene glycol acrylates, oligoethylene glycol methacrylates, oligopropylene glycol diacrylates, oligopropylene glycol dimethacrylates, oligopropylene glycol acrylates, oligopropylene glycol methacrylates and mixtures thereof.

In some examples, the crosslinkers may be selected from the group consisting of: dimethacrylates, trimethacrylates, tetramethacrylates, diacrylates, triacrylates, and tetraacrylates.

In some examples, the initiator may be at least one of a thermal initiator and a photoinitiator.

In some examples, the device may be an adhesive label.

In some aspects, there is provided an anti-counterfeit device incorporating the device described above.

The present disclosure also provides methods of manufacture and use of the device described above. In some aspects, there is provided a method of manufacturing a photonic crystal device comprising: providing a template; infiltrating the template with a prepolymer mixture; curing the prepolymer mixture to form a polymer matrix; removing the template, the remaining polymer matrix forming a photonic crystal material; and attaching a removably attachable removal layer to the photonic crystal material.

In some aspects, there is provided a method of verifying an article comprising: providing the device described above on the article; detecting the first optical effect; removing at least a portion of the removal layer; and detecting the second optical effect.

BRIEF DESCRIPTION OF THE DRAWINGS

Aspects of the present disclosure will be discussed in detail below, with reference to the drawings in which.

DETAILED DESCRIPTION

Figure 1:
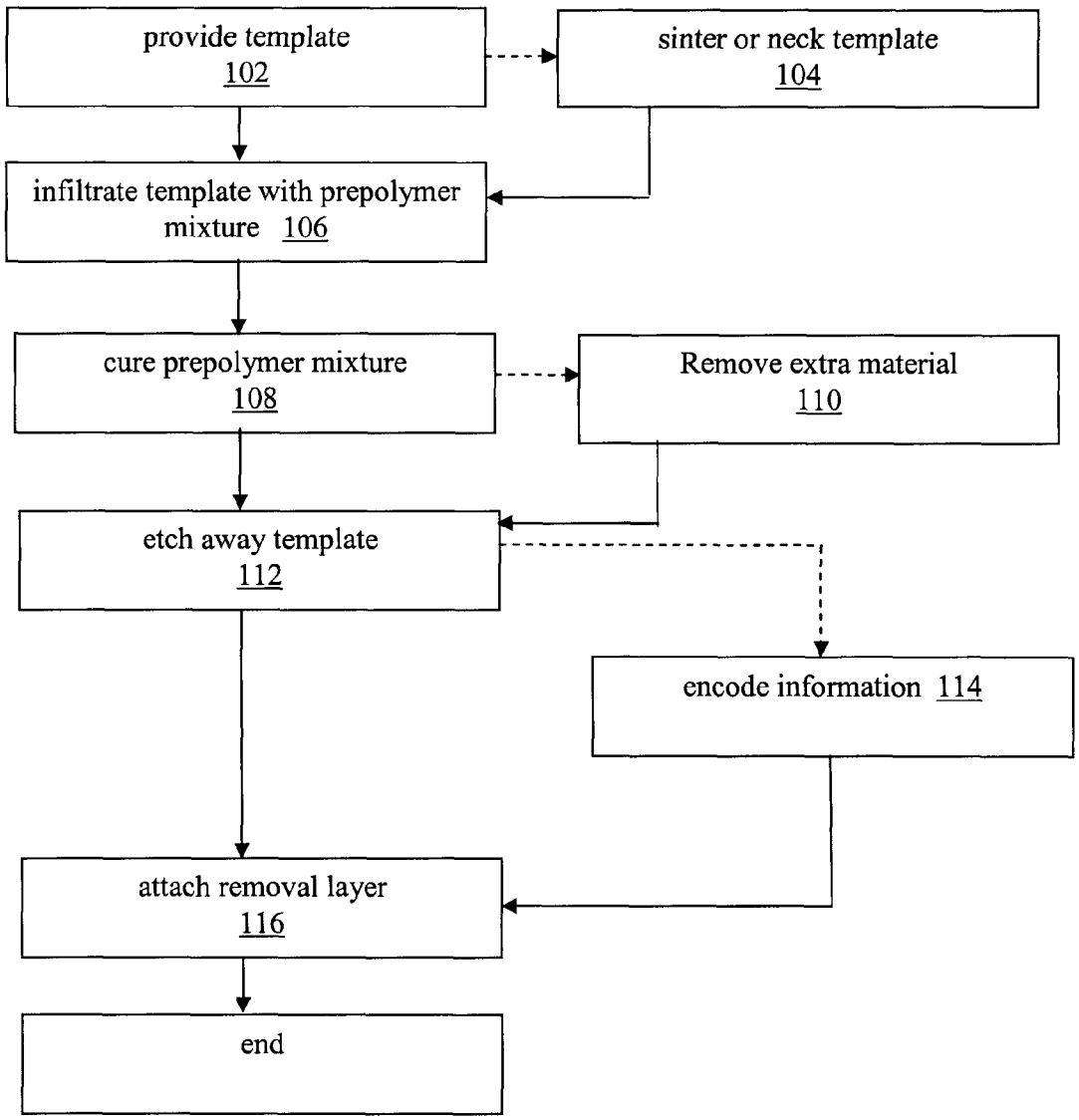
FIG. 1 is a flowchart showing steps in an example method of manufacturing a photonic crystal device.

All examples and embodiments discussed in the present application are for purposes of illustration only and are not intended to be limiting.

A photonic crystal device is disclosed, based on photonic crystal materials, in particular tunable photonic crystal materials. The photonic crystal device may also be referred to as a peelable photonic crystal device, as the device includes a removal layer that is removed or "peeled". The photonic crystal device, exhibits wavelength reflections and transmissions. These reflections and transmissions can be selectively tailored to be within the ultraviolet, visible, or infrared range of the electromagnetic spectrum, depending on the designed structure and/or dimensions of the photonic crystal device, particularly the photonic crystal material of the device.

In some examples, the photonic material of the device is a deformable photonic crystal material. The photonic crystal material has an ordered structure, such as an ordered lattice spacing (e.g., where the photonic crystal material is a 3-dimension photonic crystal, such as an inverse photonic crystal). In some example embodiments, the photonic crystal material has an ordered array of voids and may be polymer-based, so as to be deformable. The photonic crystal may be fabricated so as to have a characteristic reflection peak from an incident surface.

The photonic crystal material, may undergo diffraction of light due to an internal structure. This diffraction may be manifest as a reflection of a certain wavelength range for light incident to an incident surface of the photonic crystal.

The photonic crystal device includes a photonic crystal material and a removal layer. The photonic crystal material has an initial ordered structure (e.g., the structure given during manufacturing) and a viewing surface (also referred to as a top surface). The initial ordered structure of the photonic crystal material gives rise to a first optical effect that is detectable from the viewing surface. Detection of the first optical effect can be visually using the unaided eye, or through the use of an apparatus, such as an infrared or ultraviolet detector.

The removal layer is removably attached to the photonic crystal material, either on the viewing surface or opposite the viewing surface on an opposing surface. In some examples, the removal layer is removably attached using a relatively weak adhesive, such that the removal layer can be removed (e.g., peeled off) by manual force.

The mechanical removal of at least a portion of the removal layer results in a structural change in the ordered structure of the corresponding portion of the photonic crystal material. For example, because the removal layer is adhered to the photonic crystal material, removal of the removal layer exerts a pulling force or mechanical strain on the photonic crystal material, causing a structural change in the ordered structure of the photonic crystal material. The structural change results in a changed portion in the photonic crystal material having a structure different from the initial ordered structure and giving rise to a second optical effect detectable from the viewing surface and detectably different from the first optical effect.

In some examples, the device includes a support layer attached to the photonic crystal material for supporting the photonic crystal material. The support layer is provided on a surface of the photonic crystal material opposite to the removal layer. Typically, the support layer is permanently attached to the photonic crystal material, for example, using a permanent adhesive.

Typically, the removal layer can be removed from the photonic crystal material at some measure of strain. For example, where the removal layer is removably attached to the photonic crystal material using an adhesive, the amount of strain or force required to remove the removal layer can be dependent on the strength of the adhesive used. Where the device includes a support layer, the photonic crystal material typically mostly remains on the support layer after removal of the removal layer. For example, the support layer can be attached to the photonic crystal material using an adhesive that is stronger than the adhesive used to attach the removal layer.

The photonic crystal device initially exhibits a first optical effect. When the removal layer, such as an adhesive plastic overlayer, is mechanically removed (e.g., peeled away) from the photonic crystal material, the structure of the photonic crystal material is deformed. This results in a change to a second optical effect that is different from the first optical effect. For example, this changed structure may give rise to a change in light diffracted from the photonic crystal material. This may be manifest as a change in reflectance, for instance as a change in reflection from a first wavelength range for light incident to the viewing surface to a second wavelength range. If the first and second wavelength ranges are in the visible spectrum of light, at least a portion of the device will exhibit visible change from a first color to a second color. This color change may be short lasting, long lasting, or permanent. The duration of the color change can be selectively engineered through the choice of the material composition of the photonic crystal device. In addition to changes from one color to another, removal of the removal layer can also result in transitions from colorless (i.e., reflectance wavelengths outside of the visible spectrum) to colored (i.e., reflectance wavelengths within the visible spectrum), or colored to colorless optical effects.

In this disclosure, an optical effect is understood to include effects within the visible spectrum, but also effects outside the visible spectrum, for example in the infrared or ultraviolet ranges. For example, changing from the first to the second optical effect can be a change of a reflectance from a first infrared wavelength range to a second infrared wavelength range. In another example, changing from the first to the second optical effect can be a change of a reflectance from a first visible wavelength range to a second infrared wavelength range. Other similar optical effects are possible, involving combinations of wavelengths ranging from ultraviolet, through the visible spectrum, to infrared.

In some examples, at least one of the removal layer and the support layer (in cases where there is a support layer) is translucent or transparent, such that the photonic crystal material is viewable through the removal layer and/or the support layer. In some examples, the removal layer and/or the support layer contributes to the optical effect, such as by providing a background color or pattern.

The removal layer and/or the support layer can be provided on all or a portion of the respective surface of the photonic crystal material. In some examples, the photonic crystal device has a support layer supporting the entire photonic crystal material and a removal layer attached to the entire viewing surface (or opposing surface) of the photonic crystal material. In other examples, the photonic crystal material is entirely supported by the support layer and the removal layer is attached only to a portion of the photonic crystal material.

In some examples, there is a non-adhesive layer that is provided between at least a portion of the photonic crystal material and a respective portion of the removal layer. The non-adhesive layer prevents attachment of that portion of the photonic crystal material to the respective portion of the removal layer, with the result that when the removal layer is removed, the portion of the photonic crystal material having the non-adhesive layer does not experience any mechanical strain and does not change its ordered structure. Thus, the portion of the photonic crystal material having the non-adhesive layer does not give rise to a second optical effect after removal of the removal layer. The non-adhesive layer can be selectively applied, for example in order to encode information, such as a pattern, a logo, an image or alphanumeric characters, that is revealed when the removal layer is removed. Encoding information will be described in further detail below.

Figure 3:
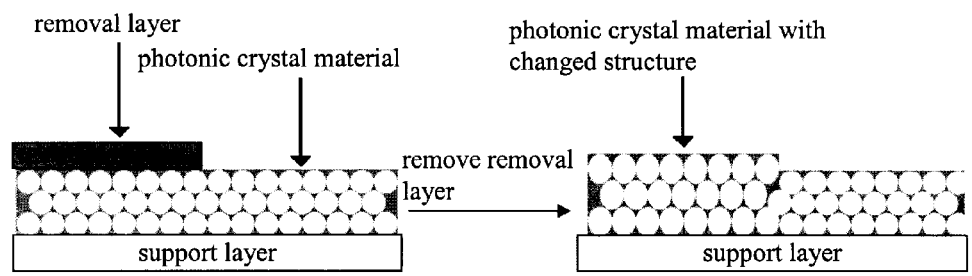
FIG. 3 is a schematic drawing of an example photonic crystal device in use.

FIG. 3 illustrates schematically the cross-section of an example device showing the removal of the removal layer. Here, removal of a portion of the removal layer causes the ordered structure (in this example, an ordered array of voids) of the respective portion of the photonic crystal material to be stretched out, resulting in a changed portion having a stretched ordered structure, thus creating a change in the reflected wavelength of the changed portion.

Figure 5:
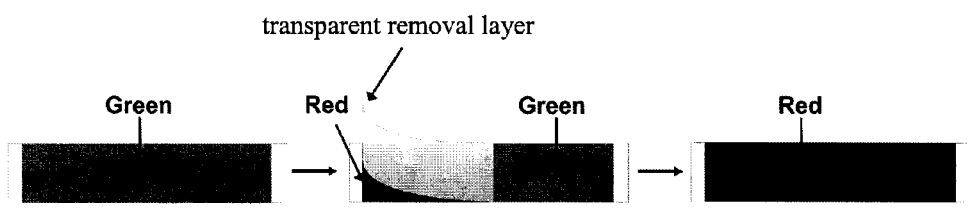
FIG. 5 is a schematic drawing illustrating a color change in use of an example photonic crystal device.

FIG. 5 shows a schematic illustration of a top view of another example device, where the optical effect changes from a green to a red color upon removal of the removal layer. Again, removal of the removal layer results in a visible color state change due to the stretching of the ordered structure of the photonic crystal material.

In some examples, a portion of the photonic crystal material is removed with the removal layer, for example where the attachment between the removal layer and the photonic crystal material is particularly strong in certain portions.

Figure 4:
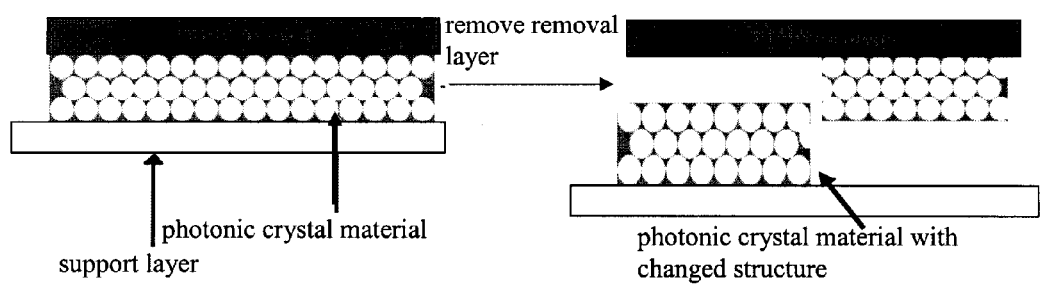
FIG. 4 is a schematic drawing of an example photonic crystal device in use.

FIG. 4 illustrates schematically the cross-section of an example device where a portion of the photonic crystal material is removed with removal of the removal layer, while a remaining portion remains on the support layer and has a changed ordered structure.

Figure 6:
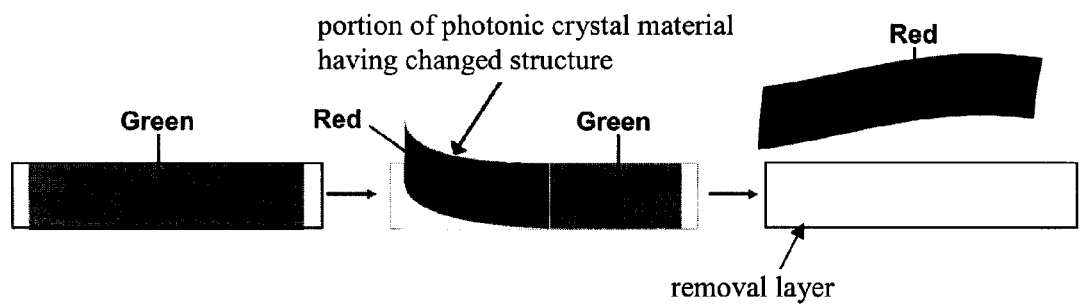
FIG. 6 is a schematic drawing illustrating a color change in use of an example photonic crystal device.

In FIG. 6, a top view of an example photonic crystal device is shown. Here, the removal layer serves as a bottom layer. This illustrates that although the disclosure describes "peeling" of the removal layer from the photonic crystal material, the reverse is also possible—that is, the "peeling" of the photonic crystal material from the removal layer, in some examples aided by a support layer supporting and offering mechanical strength to the photonic crystal material.

The strength of attachment of the removal layer to the photonic crystal material may influence the degree of change in the ordered structure of the photonic crystal material and hence the degree of difference between the first and second optical effects. For instance, if the removal layer is relatively strongly attached to the photonic crystal material, the photonic crystal material may deform to a relatively greater extent when the removal layer is removed, giving rise to a greater difference between the first and second optical effects. Conversely, if removal layer is relatively weakly attached to the photonic crystal material, the photonic crystal material may deform to a relatively lesser extent when the removal layer is removed, giving rise to a lesser difference between the first and second optical effects.

The disclosed photonic crystal device may be incorporated into a security and/or authentication device. The device may include additional substrate layers and/or protective layers, depending on application. The device may be attached to an article, for example using an adhesive, or may be manufactured directly on an article. Although the examples below illustrate example devices having a support layer, in some example embodiments, the device does not include a support layer. Where there is no support layer, the photonic crystal material may have sufficient mechanical strength to be handled directly, and may be applied directly to an article (e.g., using a separate adhesive strip).

Following the removal of the removal layer, the resulting change to the second optical effect may be permanent, such that the appearance of the device would remain static. Thus, the device may be designed for a one-time use.

Alternatively, the device may be fully or partially reversible. For example, the second optical effect may revert back to the first optical effect over time (e.g., at a certain reversal rate), as the structure of the photonic crystal device relaxes back to the initial ordered structure. The rate at which this process occurs is typically related to a property of the photonic crystal material, such as a component of the photonic crystal material. The reversal rate may also be influenced by one or more external stimuli, such as air pressure, mechanical stress or strain, temperature, or water vapor. In some examples, reversal may be prevented by an external stimulus. In some examples, the device may be partially reversible, in which case the device may revert towards the first optical effect, but not fully, for example where the first and second optical effects are first and second reflected wavelengths, the device may revert only as far as an intermediate wavelength between the first and second wavelengths.

Where the device is reversible, whether fully or partially, the removal layer may be optionally re-attached to the photonic crystal material. The device can thus be reused.

In some example embodiments, the photonic crystal material is a thin-film material, for example equal to or less than approximately 100 micrometers in thickness. In some examples, the photonic crystal material is an inverse photonic crystal material, with voids having an average diameter in the range of about 50 nm to about 1000 nm, in some cases in the range of about 180 nm to about 900 nm. The voids may be spherical and may be interconnected.

In some examples, the removal layer (and the support layer, where present) are in the form of films, for example equal to or less than approximately 1 millimeter in thickness. The removal layer (and the support layer, where present), may be made of materials including papers, glasses, plastics, metals, ceramics, or combinations thereof. In some examples, the removal layer is flexible to allow it to bend when peeled.

In some examples, the photonic crystal material comprises a polymer. The polymer may be selected from the group consisting of: polystyrenes, polymethacrylates, polyacrylates, polyurethanes, polyesters, polyethylenes, polypropylenes, polyvinylchlorides, polyisoprene, polybutadiene, polydienes, waxes, and copolymers or combinations thereof. The polymer may be a cross-linked polymer network.

The polymer may comprise linear polymer chains, or may contain a given density of cross-linking groups in order to provide a cross-linked polymer network. These crosslinks may be, for example, based on covalent bonds, ionic bonds, polar covalent bonds, chemical bonds, physical bonds, dispersion interactions, Van Der Waals interactions, nanoparticle interactions, surface interactions, hydrogen bonds, coordination bonds, electrostatic interactions, hydrophobic interactions, fluorophobic interactions, phase-separated domains, or combinations thereof. The density and distribution of crosslinks throughout the polymer may be selected to provide the polymer with certain stiffness or flexibility. For example, a higher density of crosslinks may result in a stiffer polymer photonic crystal material and may result in a smaller deformation response in the ordered structure when the removal layer is removed.

Examples

Figure 2:
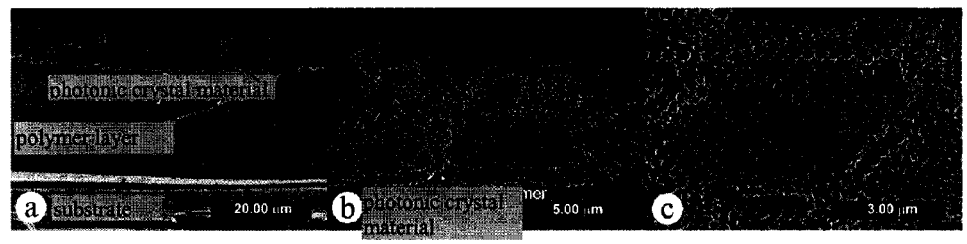
FIG. 2 shows scanning electron microscope micrograph cross-sections of an example photonic crystal device.

FIG. 2 shows electron microscopy images of an example of a photonic crystal material suitable for the photonic crystal device of the present disclosure, at different magnifications. The scanning electron micrographs show a structure of a photonic crystal material, in this example an elastic polymer photonic crystal material, supported by a polymeric substrate, and having a polymer layer. The figure shows: (a) a view of the substrate at bottom, polymer layer, and photonic crystal material at top, (b) a magnified view of the photonic crystal material, (c) with details of the ordered structure of the photonic crystal material. The substrate and the polymer layer can be removed from the photonic crystal material during manufacture.

Figure 7:
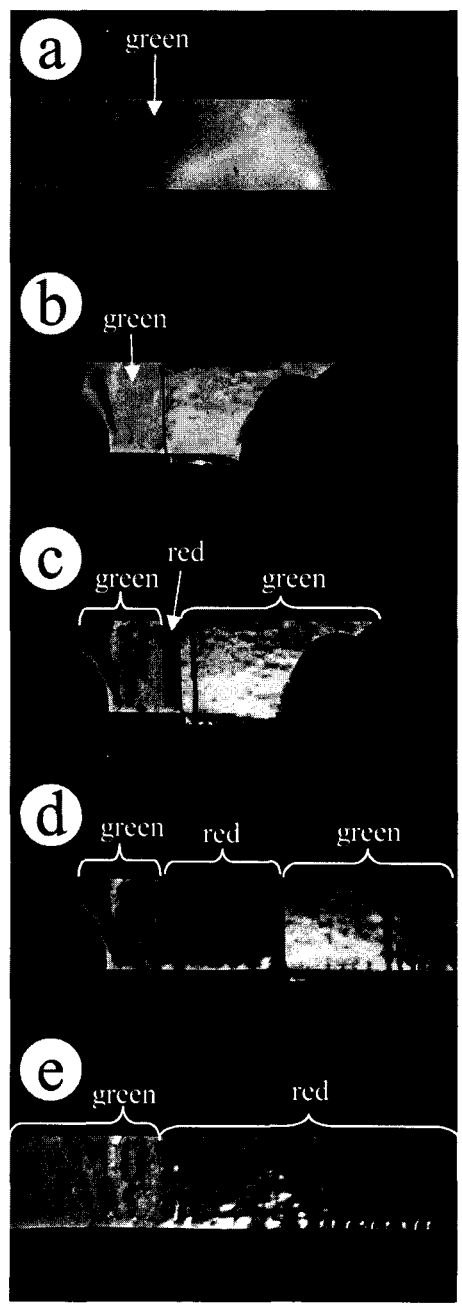
FIG. 7 shows an example polymer-based photonic crystal device in use.

FIG. 7 shows the optical effect of an example device over time as the removal layer is removed. In this example, the photonic crystal device exhibits a first optical effect that appears as a green color, and a second optical effect that appears as a red color. In FIG. 7(a), the example device (here, a device having a polymer-based photonic crystal material) shows the initial green color, and FIG. 7(b)-(e) show an image sequence of the removal layer being sequentially peeled away from the photonic crystal material and the subsequent color change from green to red due to the structural deformation in the ordered structure of the photonic crystal material.

Figure 9:
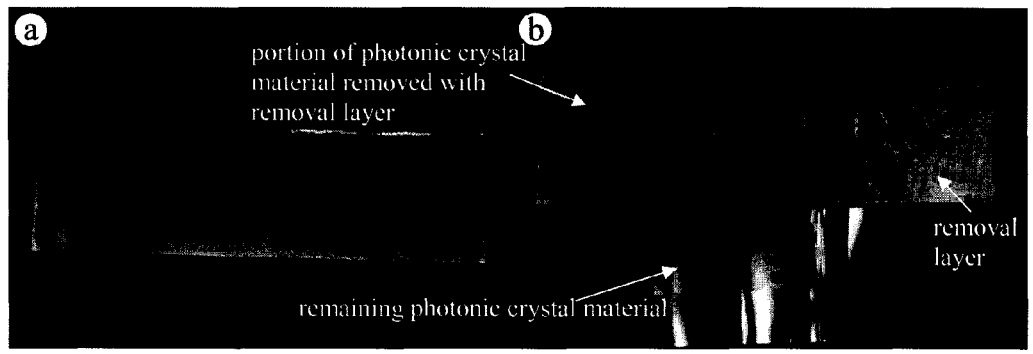
FIG. 9 shows an example character-encoded photonic crystal device in use.

FIG. 9 shows an example device where a portion of the photonic crystal material is removed with the removal layer. For example, a strong adhesive can be applied between the removal layer and the photonic crystal material at the portions that are desired to be removed with the removal layer. In another example, a non-adhesive layer can be added between the removal layer and portions of the photonic crystal material that are desired to not be removed with the removal layer. In FIG. 9(a), the device is shown before removal of the removal layer, exhibiting a green color. In FIG. 9(b) the device is shown after removal of the removal layer, with some portions of the photonic crystal material being removed with the removal layer. The remaining photonic crystal material has a deformed structure, giving rise to a second optical effect (in this case, a red color) and revealing an encoded pattern.

Figure 15:
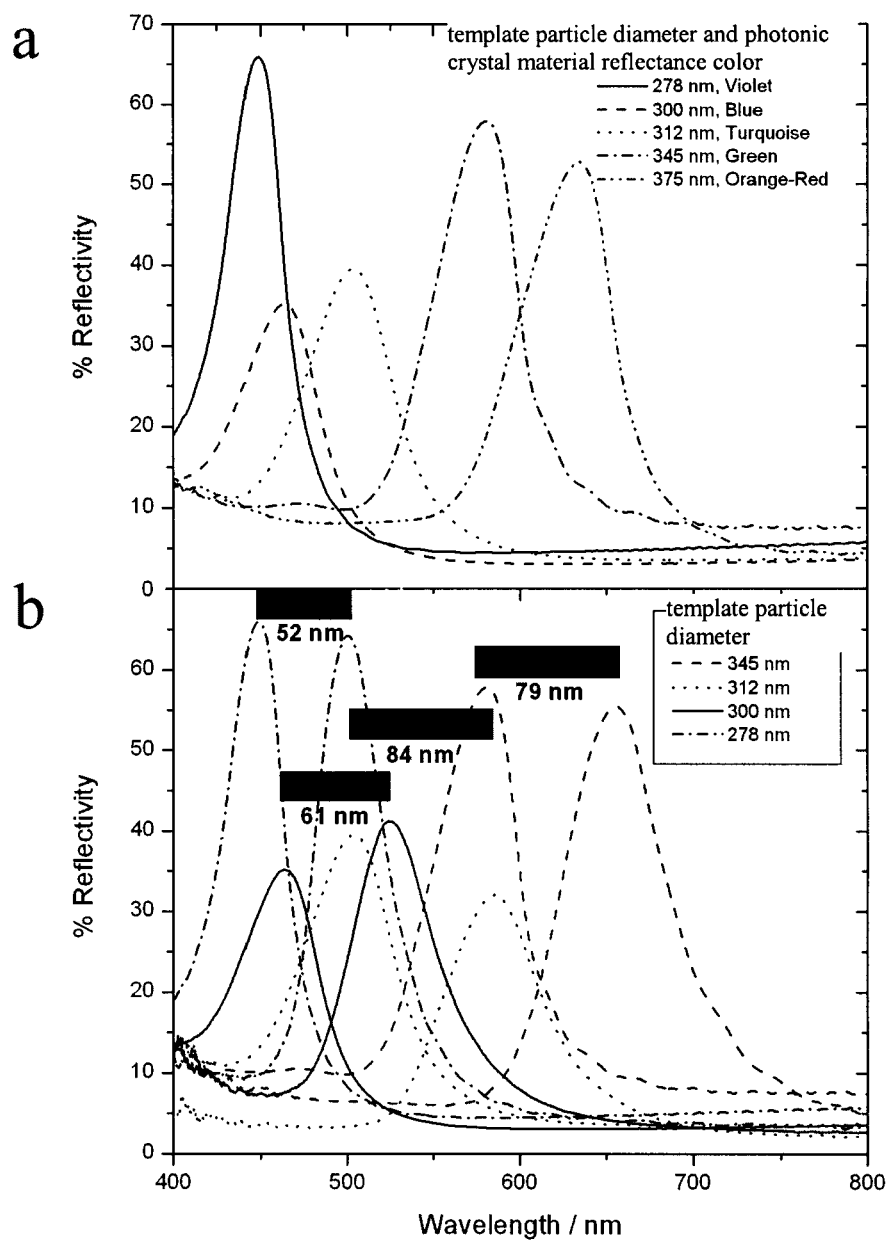
FIG. 15 shows spectra of example photonic crystal devices exhibiting different wavelength characteristics.

In another example, FIG. 15 shows the spectra of different photonic crystal devices incorporating different respective photonic crystal materials with different ordered structures, which result in the reflection of bands of wavelengths at different points in the visible spectrum. The figure shows the spectra of the devices before and after removal of the removal layer. FIG. 15(a) shows the initial spectra (representative of the first optical effect) of photonic crystal devices having photonic crystal materials made of the same polymer materials, but having different ordered structure—in this case, different lattice spacing due to being manufactured using differently-sized templates, as will be described further below. The spectra correspond to photonic crystal devices with the colours violet, blue, turquoise, and green, manufactured from 278 nm, 300 nm, 312 nm, and 345 nm template spheres, respectively. FIG. 15(b) shows the spectra of the devices 2 minutes after removal of the removal layer, showing for all example devices a shift in the wavelength band reflected from the devices—that is, a change to a second optical effect, the second optical effect being a different reflectance wavelength band. The bars indicate the wavelength shift in nanometers for each device, with shifts of 52 nm, 61 nm, 84 nm, 79 nm, for the 278 nm, 300 nm, 312 nm, 345 nm particle-based photonic crystal devices, respectively.

Figure 10:
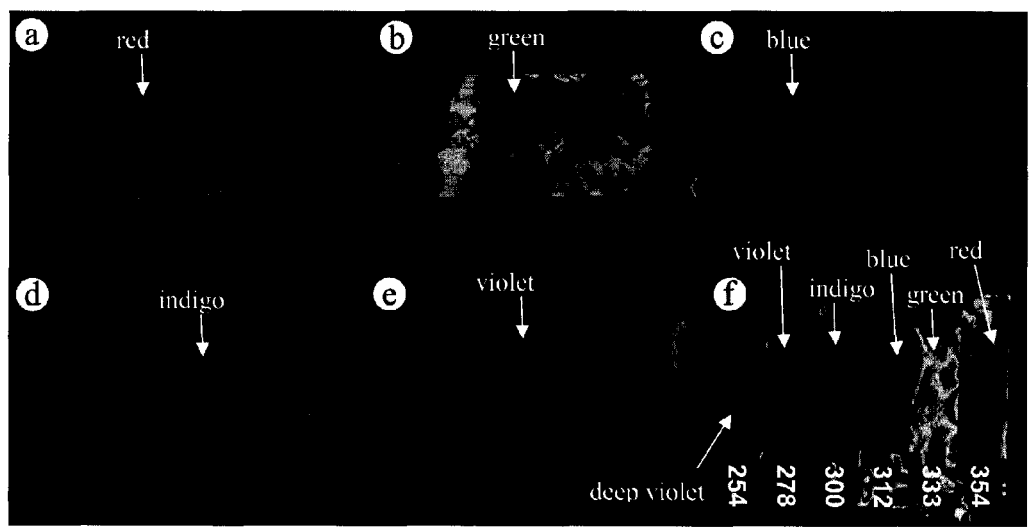
FIG. 10 shows images of example photonic crystal devices exhibiting different colors.

FIG. 10 shows images of a series of different example photonic crystal devices having photonic crystal materials with different ordered structures, resulting in visible color differences between devices. In this example, the different photonic crystal materials are inverse photonic crystal materials manufactured with templates having differently-sized particle spheres. The figures (a) to (e) show the color variation with photonic crystal materials manufactured with descending template sphere diameters, ranging from 375 nm to 278 nm, yielding the initial reflectance colors red, green, blue, and violet. (f) shows a direct comparison of six different example photonic crystal materials (in this case, elastic polymer photonic crystal materials), manufactured using templates with sphere diameters ranging from 254 nm to 375 nm.

Figure 13:
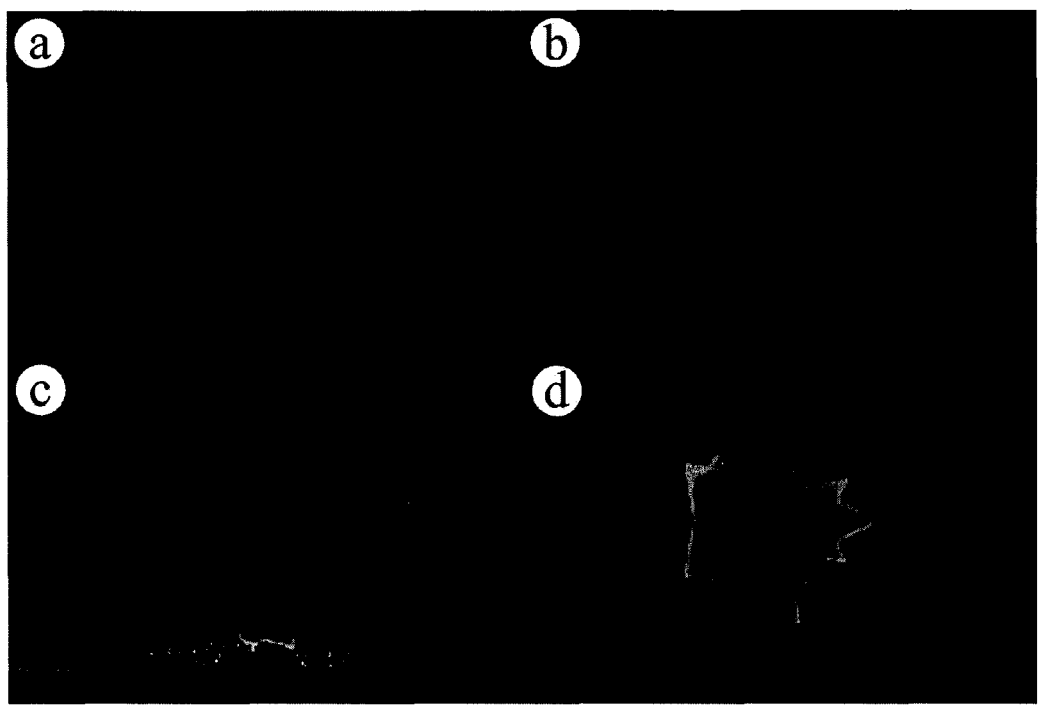
FIG. 13 shows images of example logo-encoded photonic crystal devices exhibiting different colors.

FIG. 13 shows examples demonstrating that the wavelengths of the first and second optical effects can be independently selected by design. In these examples, the photonic crystal device is designed to show a maple leaf image, which exhibits the change in optical effect, due to change in the ordered structure of the portion of the photonic crystal material within the leaf image. The different examples show different photonic crystal devices having second optical effects exhibiting a maple leaf logo that appears: (a) blue, (b) green, (c) orange, and (d) red. Again, different reflectance wavelengths are the result of different photonic crystal materials manufactured using differently-sized template spheres. Encoding of the maple leaf logo will be described in further detail below.

Figure 12:
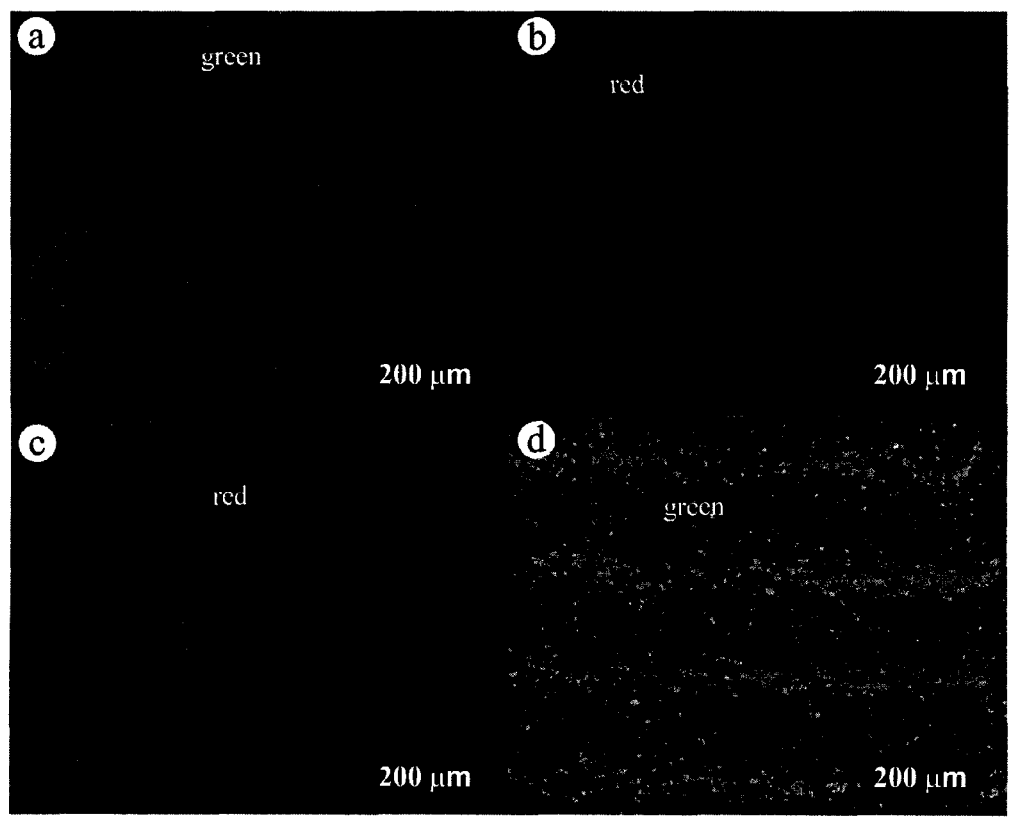
FIG. 12 shows optical microscope images showing the colors of an example photonic crystal device.

FIG. 12 shows a series of optical micrographs, showing the first optical effect (here, an initial color) of an example device in reflected and transmitted light, as well as its second optical effect (here, a different color) in reflected and transmitted light after removal of the removal layer. Micrographs (a), (b) and (c), (d) constitute pairs illustrating the color state of the example photonic crystal device before (a, b) and after (c, d) removal of the removal layer. Micrographs (a) and (c) were taken in reflection mode, micrographs (b) and (d) in transmission mode.

Figure 16:
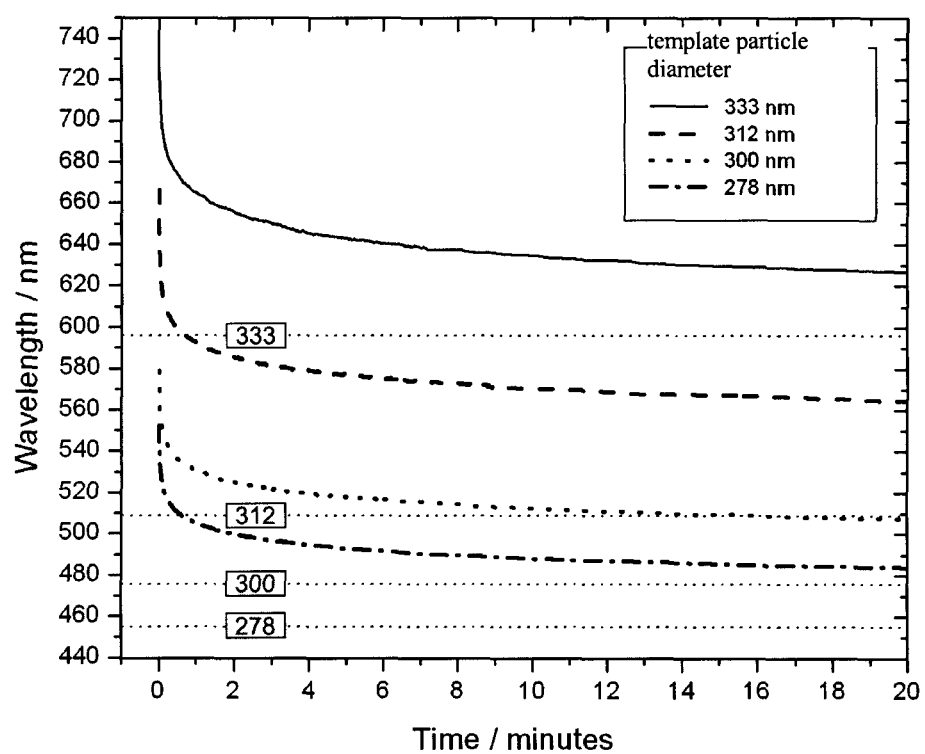
FIG. 16 shows plots illustrating the reversal of example photonic crystal devices.

FIG. 16 shows the relaxation curves, that is the reversion of the second optical effect back to the first optical effect, of photonic crystal devices having photonic crystal material of identical composition manufactured from templates with varying particle sizes. The horizontal lines represent the original wavelength positions of the peaks for photonic crystal devices manufactured from templates made of 278 nm, 300 nm, 312 nm, and 333 nm particles, respectively.

Figure 17:
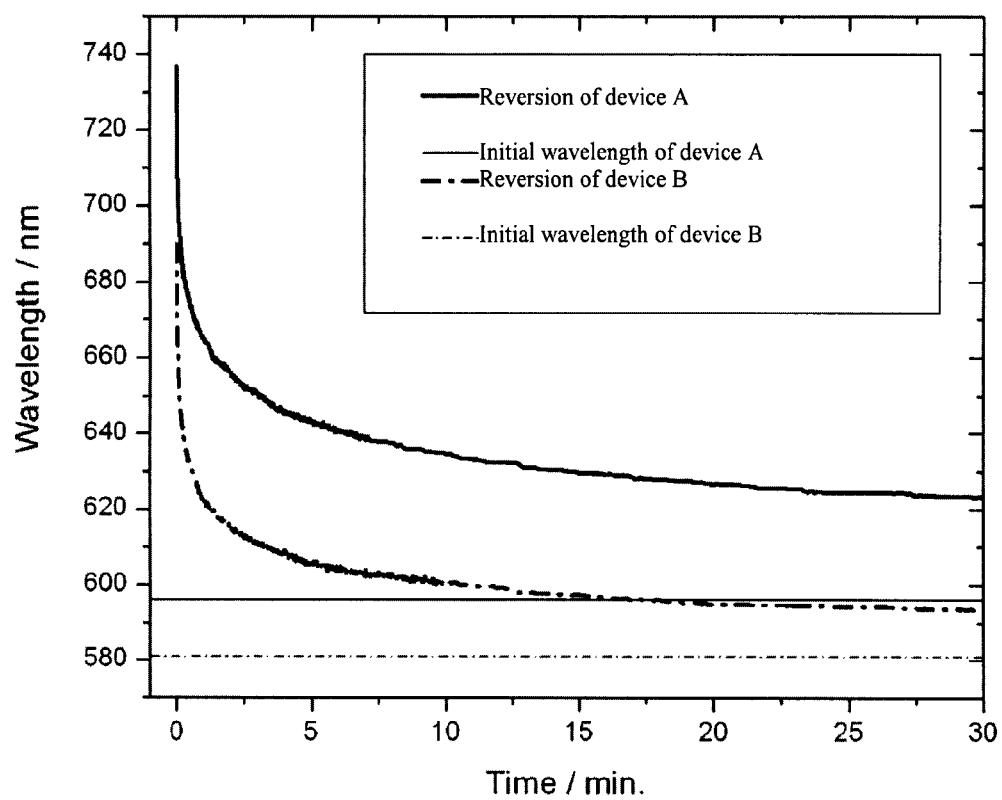
FIG. 17 shows plots illustrating the reversal of example photonic crystal devices compared to initial wavelengths.

FIG. 17 shows plots illustrating the reversion of the second optical effect back to the first optical effect for two example photonic crystal devices. Device A has a photonic crystal material manufactured using template spheres of about 348 nm in diameter, and exhibits a first optical effect of reflectance wavelength around 596 nm. Device B has a photonic crystal material manufactured using template spheres of about 348 nm in diameter where the photonic crystal material includes about 10% polyetheracrylate material, and exhibits a first optical effect of reflectance wavelength around 580 nm.

Encoding Information

In some examples, the disclosed device also includes encoded information. The photonic crystal based device may include an underlying image, data content, or color. The perception of such underlying features may be changed when the removal layer is removed. For example, the removal of the removal layer may give rise to overtly or covertly encoded information, such as alphanumeric characters, images, patterns or logos, as well as simple changes in reflectance wavelengths.

In some examples, information can be encoded into the photonic crystal device by using different materials or compositions within the photonic crystal material. This can be done by introducing different precursor mixtures in the manufacture of the photonic crystal material, as will be described further below. Different materials will give rise different responsiveness (i.e., different degrees of change in the ordered structure) in the photonic crystal material when the removal layer is removed, giving rise to different optical effects in different portions of the photonic crystal device. The different materials may thus be applied to produce encoded information, including alphanumeric characters, images, logos, patterns, etc. The photonic crystal device can thus include portions having a greater response and portions having a lesser or no response to removal of the removal layer. Other different responses to removal of the removal layer can include, for example: no change, irreversible change, reversible changes with varying relaxation times in different portions, and changes to different pre-selected optical effects in different portions.

In some examples, information can be encoded into the photonic crystal device by using a removal layer, support layer or other addition layer that includes encoded information. For example, the removal layer of an example photonic crystal device can include a colored pattern, hologram or holographic information, printed information (including alphanumeric characters, logos, images, or patterns), a pattern of transparent or opaque regions, a pattern of low and high reflectiveness, or other such information. In some examples, such information may be covered or obscured by the photonic crystal material and revealed on the removal layer upon removal of the removal layer.

In other examples, such information may be encoded on a support layer or other layer/surface and the photonic crystal material initially has a reflectance wavelength (e.g., within the visible spectrum) that covers or obscures the information. Removal of the removal layer causes the photonic crystal material to have a reflectance wavelength outside the visible spectrum, thus revealing the encoded information. Thus, the first optical effect is the color initially reflected by the photonic crystal material, and the second optical effect is the perceived information.

In other examples, attachment between the removal layer and the photonic crystal material may be in an encoded pattern (e.g., by applying an adhesive layer in an encoded pattern between the removal layer and the photonic crystal material). The information will then be revealed by a selective change in the structure of the photonic crystal material corresponding to the encoded pattern of attachment, resulting in a patterned second optical effect. Alternatively or in addition, one or more portions of the photonic crystal material can be removed with the removal layer, corresponding to the encoded pattern of attachment, for example as shown in FIG. 9, revealing the encoded pattern in the portions not removed with the removal layer.

In some examples, a patterned adhesive can be applied by laminating a patterned adhesive or by printing suitable adhesive precursors and/or mixtures between the photonic crystal material and the removal layer.

The adhesive can applied with a pattern of different adhesive strength, for example with a pattern of strong, medium strength, and no adhesive areas. The pattern will be revealed after removal of the removal layer. In areas of strong adhesion, the portions of the photonic crystal material removal are removed with the removal layer. In areas of medium adhesion the ordered structure of the photonic crystal material is changed. In areas where the adhesive is absent, the ordered structure of the photonic crystal material is unchanged.

Figure 8:
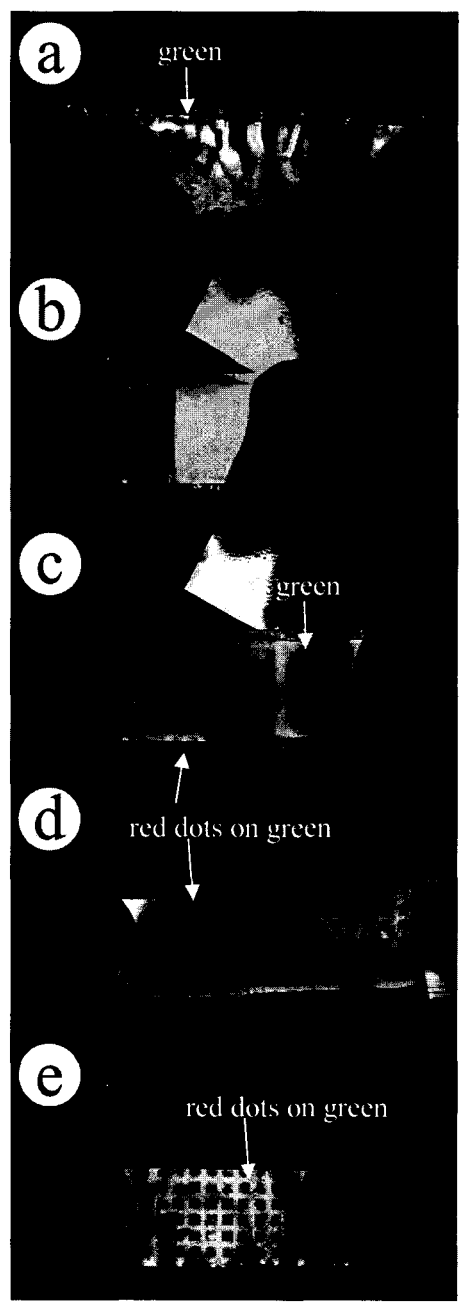
FIG. 8 shows an example polymer-based photonic crystal device in use.

For example, the adhesive layer may be applied only on selected spots. Before removal of the removal layer, no pattern is seen on the device. When the removal layer is removed, stretching of the photonic crystal material structure occurs at the selected spots having the adhesive, with the remaining areas of the photonic crystal material being unaffected. This results in a color or reflected wavelength change only at those selected spots, thus revealing a pattern. The adhesive pattern may be applied by various common methods, including printing, lithography and imprinting. An example is shown in FIG. 8.

In some examples, information can be encoded into the photonic crystal device by incorporation of an encoding component into the photonic crystal device, for example by vapor deposition or printing of organic, polymeric, inorganic, or nanoparticulate material onto the surface or into the interior structure of the photonic crystal device in a pre-selected pattern/logo/image/etc. Such incorporation of an encoding component changes the optical and/or mechanical and/or adhesive properties of the device according to the pre-selected pattern/logo/image/etc, affecting the first and second optical effects. Printing of such components can include, for example, thermal printing, ink-jet printing, screen printing, and other printing process or combinations thereof. The encoding component can be added to encode information, such as alphanumeric characters, images, logos, patterns, or combinations thereof.

In some examples, information can be encoded into the photonic crystal device by hot stamping or imprinting onto the photonic crystal material, thus changing the ordered structure permanently (e.g., by collapsing the structure) leading to colorless or unresponsive regions and thereby encoding information by creating a pattern/logo/image/etc. using the colorless or unresponsive regions.

In some examples, information can be encoded into the photonic crystal device by introducing a fluorescent component such as dyes, molecules, nanoparticles and/or nanorods into the photonic crystal device. The fluorescent component may be introduced into the photonic crystal material during manufacture, such as during the infiltration of the template with a precursor mixture, described below, or may be introduced separating, such as through printing techniques. The fluorescent component may also be introduced into the photonic crystal material by infiltrating or printing solutions containing the fluorescent component onto the surface of the material. The fluorescent component may also be provided (e.g., etched into) the removal layer or another layer, such as the support layer. Depending on the excitation wavelength or fluorescence wavelength of the employed fluorescent component, the fluorescence may be observable all the time in the presence of an excitation light source, or the fluorescence may only become observable after removal of the removal layer and irradiating the newly-exposed fluorescent component with an excitation light source. The fluorescence may only become visible by changing the wavelength state of the photonic crystal material from one wavelength state to another through the removal of the removal layer. For example, the initial wavelength state of the photonic crystal material might block the wavelength of the excitation source, e.g. a green laser, while the changed wavelength state allows the transmission of the excitation wavelength thus giving rise to fluorescence. In another example, the initial wavelength state of the photonic crystal material may allow transmission of an excitation wavelength while the changed wavelength state blocks the excitation wavelength.

Example methods of encoding information content may include:

Patterned photonic crystal material: Variations in material topology; Variations in composition resulting in different adhesion; Variations in composition resulting in different deformability; Variation in composition resulting in changed relaxation rate; Variation in composition resulting in different extent of difference between first and second reflectance wavelength range;

Patterned adhesive layer: Adhesive/non-adhesive; Variations in adhesion; Variations in height/thickness;

Patterned non-adhesive layer: Completely non-adhesive regions; Partially non-adhesive regions leading to a lower adhesive strength between removal layer and photonic crystal material.

Examples

FIG. 8 shows a photographic image sequence (a)-(e) of an example device having covertly patterned removal layer being peeled away. Upon performing the peeling action, the device changes its color state from green to red in selected areas encoded by the adhesive patterning due to the structural stretching and deformation of the photonic crystal material structure.

Figure 11:
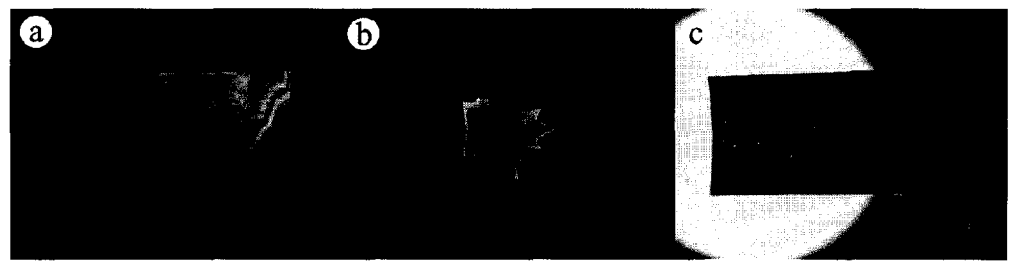
FIG. 11 shows an example logo-encoded photonic crystal device in use.

FIG. 11 illustrates an example photonic crystal device having an encoded logo. The content is overtly encoded into a non-adhesive layer screen-printed between the removal layer and the photonic crystal material. The non-adhesive layer is printed in a pattern such that there is adhesion only in a maple leaf-shaped portion. In FIG. 11(a) The outlines of a maple leaf is somewhat obscured. In FIG. 11(b), after peeling the removal layer away, a red maple leaf image is seen, due to the structural deformation of the photonic crystal material in the portion where there was adhesion between the removal layer and the photonic crystal material. (c) The image is also highly visible in transmission.

Figure 14:
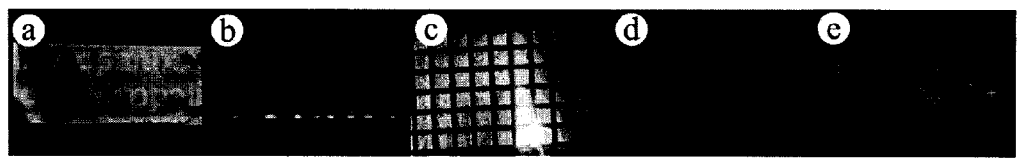
FIG. 14 shows images illustrating the use of an example photonic crystal device for overtly or covertly encoding information.

FIG. 14 illustrates example devices having different encoded information revealed after removal of the removal layer. The figure shows encoded information including: (a) characters, (b) numbers, (c) patterns or bar codes, (d) logos, (e) characters and digits. The encoded features shown in (a), (b), and (c) were covertly encoded into an adhesive layer. The features shown in (d) and (e) were encoded by printing a non-adhesive pattern between the photonic crystal material and the removal layer. As shown, encoded information content may include alphanumeric characters, patterns, logos, images, and combinations thereof.

Manufacture

FIG. 1. shows a flowchart illustrating an example method of manufacturing the photonic crystal device. Dotted lines indicate optional steps. In this example, the photonic crystal device includes an inverse photonic crystal material manufactured from a three-dimensional photonic crystal template, which can be comprised of polymer, oxide, or chalcogenide colloidal particles. The photonic crystal material in this example is manufactured on a flexible or rigid substrate that can be organic, inorganic, metallic, chalcogenic, or polymeric, or of any other suitable class of material.

At 102, the template is provided. In the case of an inverse photonic crystal material, the template is a three-dimensional template having microparticles arranged in a lattice structure.

The template for the inverse photonic crystal is formed using techniques known in the art. The template may be a close-packed 3-D structure. Any suitable substrate may be used for the template. Possible substrate materials include paper, glass, plastic, metals, and ceramics. The template may be self-assembled from microparticles, or it may be etched, for example out of a solid layer. Self-assembly methods include evaporation-induced self-assembly (EISA), isoconvective heating, sedimentation, shear assembly, parallel plate confinement, spin-coating, dip-coating, and drop-casting. Methods of sphere deposition are disclosed in U.S. Pat. No. 6,858,079. Such disclosed methods include the steps of: synthesizing monodisperse silica spheres; purifying the silica spheres; and self-assembling the silica spheres into a plurality of ordered, planar layers on a substrate. Microspheres may be synthesized according to a modified Stöber process. In an example embodiment, the microspheres may have diameters in the range of about 150-900 nm.

Microparticles suitable for making the template include, spheres, ellipsoids, rods, sphere containing polyhedra, cubes, and polyhedra, having cross-sectional dimensions from about 60 nanometers to about 100 micrometers. The microparticles may be made from materials including insulators, polymers, metals, and semiconductors. In an example embodiment, the microparticles are monodisperse microspheres (3-5%) made of silica having diameters from about 60 nanometers to about 100 micrometers. The microparticles may also be made of a polymer material, such as polystyrene and polymethacrylate.

At 104, the photonic crystal template particles may be sintered or necked to enhance the mechanical stability of the template. The photonic crystal template particles may or may not be sintered or necked to modify the mechanical or optical properties of the colloidal template or of the resulting photonic crystal device. For example, sintering or necking of the template particles results in interconnected voids in the resultant inverse photonic crystal material, which can be useful for infiltrating other components into the photonic crystal material. The sintering or necking process can be a thermal, physical, or a chemical process, or a combination of such processes. A chemical sintering or necking process can include treatment with reactive gases, wet-chemical treatment with reactive chemicals or dissolved binders or binding additives commercially available. The various processes can be applied in combination.

In an example embodiment, an overnight treatment using tetramethoxysilane vapour results in necking between template microparticles. Other suitable necking methods may be used, including necking using silicon tetrachloride vapor. Interconnection of the microparticles in the template by necking will result in interconnected voids in the resultant photonic crystal material. Interconnections may aid in later etching away the template microparticles. Template microparticles that are not removed may affect the mechanical and optical properties of the resultant photonic crystal material. Methods of necking the microspheres by vapour treatment include those disclosed in U.S. Patent Application Publication No. 2004/0062700. Disclosed methods include forming necking using a homogeneous layer of uniform and controllable thickness of a metal oxide. This metal oxide layer is grown in a layer-by-layer process and is chemically bonded to the microparticle surface and serves to enhance the mechanical stability of the template, in addition to acting to control the pore size or void volume between the microparticles in the lattice. Necking serves to control the degree of connectivity of the microparticles making up the template and, consequently, the pore size, filling fraction, mechanical stability and optical properties of the template, without disrupting its long range order and without the deleterious effects of lattice contraction induced cracking observed in conventional necking methods based on thermal sintering. Such control of the template structure may correspond to control of the resultant photonic crystal material made from that template. Necking is also possible by thermal annealing, as disclosed in U.S. Pat. Nos. 6,261,469 and 6,517,763.

At 106, the template is infiltrated the template is then infiltrated with a polymer precursor or precursor mixture. The precursor may be a mixture of monomers, crosslinkers, initiators, solvents, plasticizers, surfactants, and/or additives. The infiltration may be by way of melt infiltration, solution infiltration, gas-phase infiltration, electrophoresis, sublimation, or other suitable methods. The composition of the precursor mixture may be selected to give a desired viscosity, in order to ensure the template is fully infiltrated. When designing the precursor mixture or selecting any component, the ability of the mixture to infiltrate into the template may be worth considering. Inability of the precursor mixture to fully infiltrate the template may result in unintended air bubbles or voids in the final product. While some air bubbles (other than the intended voids) within the photonic crystal material may be acceptable, the presence of air bubbles may affect the performance of the resultant photonic crystal material. The degree of infiltration may be dependent on the molecular weight and degree of existing cross-links in the monomer and/or pre-polymer mixture. Infiltration may be aided by heat, agitation, vacuum, pressure, dilution, or other known techniques. For practical purposes, the template does not need to be completely infiltrated, and the presence of air bubbles in the final photonic crystal may be acceptable.

The precursor mixture may be a liquid, having a low vapor pressure at ambient conditions (that is, the evaporation of the mixture components is not such that it changes the ratios of the components within the mixture), stable in an uncrosslinked state (that is, it will not spontaneously crosslink before infiltration), and is cross-linkable (that is, the mixture does not contain any inhibitors that may prevent cross-links from forming or the initiator from functioning).

In some examples, the polymer photonic crystal material may be formed from a monomer and/or pre-polymer selected from the group consisting of: acrylates, methacrylate, olefins, ethers, alcohols, polyols, olefins, amino acids, fluoromonomers, biomonomers, cyclic monomers, methacrylic acid esters, acrylic acid esters, isoprene, butadiene, polyurethane precursors, crosslinkable polyethers, polymerizable oligomers and mixtures thereof. In the case of a methacrylic acid ester, it may be selected from the group consisting of ethylhexyl methacrylate, lauryl methacrylate, butyl methacrylate, methyl methacrylate, stearyl methacrylate, butoxyethyl methacrylate, and mixtures thereof. In the case of an acrylic acid ester, it may be selected from the group consisting of butoxyethyl acrylate, hydroxyethyl acrylate, 2-carboxyethyl acrylate, stearyl acrylate, lauryl acrylate, butyl acrylate, hexyl acrylate, and mixtures thereof. In the case of a crosslinkable polyether, it may be selected from the group consisting of polyether diacrylates, polyether acrylates, polyether dimethacrylates, polypropylene glycol diacrylates, polypropylene glycol dimethacrylates, polypropylene glycol acrylates, polypropylene glycol methacrylates, polyethylene glycol diacrylates, polyethylene glycol dimethacrylates, polyethylene glycol acrylates, polyethylene glycol methacrylates, oligoethylene glycol diacrylates, oligoethylene glycol dimethacrylates, oligoethylene glycol acrylates, oligoethylene glycol methacrylates, oligopropylene glycol diacrylates, oligopropylene glycol dimethacrylates, oligopropylene glycol acrylates, oligopropylene glycol methacrylates and mixtures thereof. Other polymers may be used. A wide variety of polymerizably monomers and crosslinkers are available from Sartomer Company, Inc. Other possible materials are disclosed in U.S. Pat. No. 6,946,086.

The precursor may include a crosslinker. The crosslinker may be selected from the group consisting of dimethacrylates, trimethacrylates, tetramethacrylates, diacrylates, triacrylates, and tetraacrylates. The cross-linking agent is typically selected based on the monomers or pre-polymers used.

The amount of cross-linkers and initiators in the precursor mixture may be selected to achieve a desired amount of cross-linking in the cured polymer. Possible precursor compositions include a mixtures including about 0-100 weight % monomer, 0-100 weight % cross-linker or cross-linkable polymer, and 0-20 weight % initiator. In some compositions, the cross-linker itself may be the basis for the polymer, thus forgoing the need for a monomer. The density of cross-links in the cured polymer may be controllable by the proportion of cross-linker in the precursor mixture. The porosity of the cured polymer may be controlled by including in the precursor mixture an inert substance, such as a solvent, which can be removed after curing, for example through evaporation. A variety of polymeric and non-polymeric additives may be added to modify the properties of the resulting photonic crystal material.

The precursor mixture may include an initiator. Possible initiators include photoinitiator (e.g., where curing is initiated by UV light) and thermal initiators (e.g., where curing is initiated by applying heat). The photoinitiator may be phenylbis(2,4,6-trimethylbenzoyl)phosphine oxide. If a thermal initiator is used, it may be dicumylperoxide. The initiator is typically selected based on the monomers or pre-polymers and the cross-linking agent.

As described above, the precursor mixture may include a combination of polymer precursors or encoding components (e.g., a fluorescent component) and may be infiltrated in a controlled manner, in order to encode information in the cured photonic crystal material.

At 108, the infiltrated precursor is cured, typically using chemical or physical methods. Physical methods can include thermal and radiation curing, including x-ray, gamma, infrared, visible, or ultraviolet radiation. For example, the curing may be by ultraviolet (UV), air-curing, heat, electron beam, and other types of radiation. If the curing method is by using an electron beam, it may not be necessary to include initiators and/or cross-linkers in the precursor mixture. The curing of the precursor may take place in ambient air, or in an inert gas atmosphere (e.g. carbon dioxide atmosphere).

At 110, extra polymer material may be removed from the surface of the template, such as by mechanical peeling or abrading from the upper surface. It may be possible to control the amount of precursor infiltrated into the template, such that any extra polymer material on the surface of the template is minimized or negligible and this step may be omitted. For example, the amount of precursor dispensed into the template may be controlled by an automatic dispenser. It may be possible to remove any extra precursor material prior to curing. For example, the template may be covered with a top-sheet, which is then pressed onto the template, to squeeze out extra precursor material or prevent extra precursor material from infiltrating the template; or any extra precursor material may be scraped off the top of the template. The top-sheet may be a Mylar material that has been plasma-treated. The top-sheet may be the same material as the bottom substrate. Plasma treating the top-sheet may allow better adhesion of the precursor material to the sheet. Alternatively, the top-sheet may be designed such that the cured polymer as well as the template transfer entirely to the top-sheet. In this case the excess polymer layer would remain underneath the infiltrated template and be thus removed without affecting the properties of the cured material.

At 112, the template is removed, typically using a suitable etching reagent or combinations thereof. For example, in an aqueous or non-aqueous wet-chemical process the etching reagent can be hydrofluoric acid, a fluor-containing chemical compound, or a strong base to etch oxide or chalcogenide template particles. In other examples, organic solvents, e.g. tetrahydro furane or toluene, may be used as etching agent for polymeric template particles. In yet other examples, polymeric or organic template particles may also be removed using an air-oxygen, oxygen plasma, or thermal treatment. After etching, the formed photonic crystal material remains.

For example, the template may be etched away using techniques known in the art, for example by introducing hydrofluoric acid. For example, where the template comprises silica spheres, they may be etched by hydrofluoric acid, as taught by Blanco et al. in *Nature* 405 (6785):437-440 (May 25, 2000). They may also be etched by sodium hydroxide, as taught by Iler in *The Chemistry of Silica: Solubility, Polymerization, Colloid and Surface Properties and Biochemistry of Silica*, published by Wiley-Intersiences (May 1979). In examples template comprises polymer spheres, they may be dissolved away by various polymer solvents, as taught by Candau et al. in *An Introduction to Polymer Colloids*, 1st edition, published by Springer (Dec. 31, 1989). Following removal of the template, the etched structure is washed to remove any etching by-product, and is dried to generate the empty voids in the resultant photonic crystal material.

At 114, information is optionally encoded. For example, any of the encoding methods described above may be carried out, such as the application of a patterned non-adhesive layer, application of patterned adhesive.

At 116, the removal layer is attached to the photonic crystal material. For example, thermal or pressure lamination or a combination of both can be used to laminate the removal layer to the photonic crystal material. The removal layer may be additionally supported by another layer to give it mechanical strength. The removal layer may be applied, for example by printing, coating, spraying, lamination, laser transfer, dipping, hot stamping, or any other suitable method.

The photonic crystal device may have a photonic crystal material in the form of flakes or particles. For example, the photonic crystal material may be similar to that described in U.S. Patent Application No. 61/109,956 for which a PCT application was filed on Jul. 23, 2009. The flakes can be printed onto a suitable support layer to deposit photonic crystal material flakes in a pattern, for example with overt or covert information content.

Applications

The photonic crystal device may find application in the field of anti-counterfeit security features, tamper-proof packaging, tracking devices in manufacturing, processing, and product distribution, among others. The device may find use in the fields of: a) documents of value, including legal tender, bills of exchange, money orders, share certificates, bonds, stamps, land titles; b) cards and Identification, including passports, birth certificates, driver licenses, visa documents, health cards, social security cards, national identity cards, work permits, citizenship documents, alien registration documents, credit cards, debit cards, gift cards, access passes, and membership cards; and c) product packaging and tagging, including that for over-the-counter and prescription drugs, medicines and pharmaceuticals, vaccines, vitamins, nutritional supplements, herbal formulations, herbicides, pesticides, apparel, accessories, watches, clothes, shoes, handbags, cosmetics, toys, jewelry, gems, precious metals, compact discs, videotapes, DVDs, computer software, video games, other media, technology products, batteries, airline parts, auto parts, small arms, wine, spirits, beer, cigarettes, cigars, books, sports equipment and memorabilia, collectibles, and antiques.

The photonic crystal device may find application in the field of anti-counterfeit security features, tamper-proof packaging, tracking devices in manufacturing, processing, and product distribution, among others. The described device could be useful, for instance, for a re-usable or one-time-use security device, safety seal, or tamper-evident label, among other possibilities.

The embodiments of the present disclosure described above are intended to be examples only. Those of skill in the art may effect alterations, modifications and variations to the particular embodiments without departing from the intended scope of the present disclosure. In particular, selected features from one or more of the above-described embodiments may be combined to create alternative embodiments not explicitly described, features suitable for such combinations being readily apparent to persons skilled in the art. The subject matter described herein in the recited claims intends to cover and embrace all suitable changes in technology. All references mentioned are hereby incorporated by reference in their entirety.

The invention claimed is:

1. A photonic crystal device comprising:
a photonic crystal material having an initial ordered structure and a viewing surface, the initial ordered structure giving rise to a first optical effect detectable from the viewing surface; and
a removal layer removably attached with the viewing surface or an opposing surface of the photonic crystal material opposite to the viewing surface;
wherein mechanical removal of at least a portion of the removal layer results in a structural change in at least a portion of the initial ordered structure of at least a portion of the photonic crystal material respective to the portion of the removed removal layer, thereby resulting in a changed portion different from the initial ordered structure, the changed portion giving rise to a second optical effect detectable from the viewing surface and detectably different from the first optical effect.

2. The device of claim 1 further comprising a support layer attached to the photonic crystal material for supporting the photonic crystal material, the support layer being provided on a surface of the photonic crystal material opposite to the removal layer.

3. The device of claim 1 wherein the structural change results from mechanical strain of at least the portion of the photonic crystal material caused by removal of at least the portion of the removal layer.

4. The device of claim 1 wherein the ordered structure comprises an ordered lattice of voids.

5. The device of claim 1 wherein the first optical effect is a first reflectance in a first wavelength range for light incident to the viewing surface;
and wherein the changed portion includes a deformation in the ordered structure respective to the changed portion, the deformation resulting in the second optical effect being a second reflectance in a second wavelength range for light incident to the viewing surface.

6. The device of claim 1 wherein the changed portion returns to the initial ordered structure at a reversal rate, resulting in a return from the second optical effect to the first optical effect.

7. The device of claim 6 wherein the photonic crystal material is susceptible to an external stimulus, the external stimulus preventing the changed portion from returning to the initial ordered structure.

8. The device of claim 6 wherein the reversal rate is dependent on an external stimulus.

9. The device of claim 8 wherein the external stimulus is one of: temperature, water vapor, mechanical deformation, mechanical strain, mechanical stress, and air pressure.

10. The device of claim 1 wherein at least one of the first optical effect and the second optical effect includes encoded information.

11. The device of claim 10 further comprising a non-adhesive layer between a first portion of the removal layer and a first portion of the photonic crystal material respective to the first portion of the removal layer, wherein at least a second portion of the removal layer and at least a second portion of the photonic crystal material respective to the second portion of the removal layer are free of the non-adhesive layer;
wherein the non-adhesive layer prevents structural change in the ordered structure of the first portion of the photonic crystal material when the first portion of the removal layer is removed;
and wherein the non-adhesive layer facilitates the encoded information.

12. The device of claim 1 wherein the photonic crystal material is a thin film material.

13. The device of claim 12 wherein the photonic crystal film has a thickness of less than or equal to about 100 micrometers.

14. The device of claim 1 wherein the photonic crystal material is a 3-dimensional photonic crystal material.

15. The device of claim 14 wherein the 3-dimensional photonic crystal comprises an ordered array of voids in a matrix material.

16. The device of claim 15 wherein the matrix material is a polymer.

17. The device of claim 16 wherein the polymer is selected from the group consisting of: polystyrenes, polymethacrylates, polyacrylates, polyurethanes, polyesters, polyethylenes, polypropylenes, polyvinylchlorides, polyisoprene, polybutadiene, polydienes, waxes, and copolymers or combinations thereof.

18. The device of claim 17 wherein the polymer is formed from the polymerization of a precursor mixture.

19. The device of claim 18 wherein the precursor mixture contains at least one component selected from the group consisting of: monomers, crosslinkers, initiators, solvents, plasticizers, surfactants, and additives.

20. The device of claim 18 wherein the precursor mixture contains a monomer selected from the group consisting of: acrylates, methacrylate, olefins, ethers, alcohols, polyols, olefins, amino acids, fluoromonomers, biomonomers, cyclic monomers, methacrylic acid esters, acrylic acid esters, isoprene, butadiene, polyurethane precursors, crosslinkable polyethers, polymerizable oligomers, and mixtures thereof.

21. The device of claim 18 wherein the precursor mixture contains a methacrylic acid ester selected from the group consisting of: ethylhexyl methacrylate, lauryl methacrylate, butyl methacrylate, methyl methacrylate, stearyl methacrylate, butoxyethyl methacrylate, and mixtures thereof.

22. The device of claim 18 wherein the precursor mixture contains an acrylic acid ester selected from the group consisting of: butoxyethyl acrylate, hydroxyethyl acrylate, 2-carboxyethyl acrylate, stearyl acrylate, lauryl acrylate, butyl acrylate, hexyl acrylate, and mixtures thereof.

23. The device of claim 18 wherein the precursor mixture contains a crosslinkable polyether selected from the group consisting of polyether diacrylates, polyether acrylates, polyether dimethacrylates, polypropylene glycol diacrylates, polypropylene glycol dimethacrylates, polypropylene glycol acrylates, polypropylene glycol methacrylates, polyethylene glycol diacrylates, polyethylene glycol dimethacrylates, polyethylene glycol acrylates, polyethylene glycol methacrylates, oligoethylene glycol diacrylates, oligoethylene glycol dimethacrylates, oligoethylene glycol acrylates, oligoethylene glycol methacrylates, oligopropylene glycol diacrylates, oligopropylene glycol dimethacrylates, oligopropylene glycol acrylates, oligopropylene glycol methacrylates and mixtures thereof.

24. The device of claim 18 wherein the precursor mixture contains crosslinkers selected from the group consisting of: dimethacrylates, trimethacrylates, tetramethacrylates, diacrylates, triacrylates, and tetraacrylates.

25. The device of claim 18 wherein the precursor mixture contains an initiator selected from the group consisting of a thermal initiator and a photoinitiator.

26. The device of claim 1 wherein the device is an adhesive label.

27. An anti-counterfeit device incorporating the device of claim 1.

28. A method of manufacturing a photonic crystal device comprising:
  providing a template;
  infiltrating the template with a prepolymer mixture;
  curing the prepolymer mixture to form a polymer matrix;
  removing the template, the remaining polymer matrix forming a photonic crystal material; and
  attaching a removably attachable removal layer to the photonic crystal material.

29. A method of verifying an article comprising:
  providing the device of claim 1 on the article;
  detecting the first optical effect;
  removing at least a portion of the removal layer; and
  detecting the second optical effect.

* * * * *